United States Patent [19]
Aritomi et al.

[11] Patent Number: 5,611,341
[45] Date of Patent: Mar. 18, 1997

[54] EXTERNAL TRIGGER IMAGING METHOD AND APPARATUS IN MAGNETIC RESONANCE INSPECTION APPARATUS

[75] Inventors: Toshiaki Aritomi; Tuyosi Shudo; Syouji Kondou; Kazuo Suzuki, all of Katsuta, Japan

[73] Assignee: Hitachi Medical Corporation, Tokyo, Japan

[21] Appl. No.: 180,801

[22] Filed: Jan. 10, 1994

Related U.S. Application Data

[63] Continuation of Ser. No. 741,596, Aug. 7, 1991, abandoned.

[30] Foreign Application Priority Data

Aug. 7, 1990 [JP] Japan .................................. 2-208635

[51] Int. Cl.$^6$ .................................................. A61B 5/055
[52] U.S. Cl. ........................................ 128/653.2; 324/309
[58] Field of Search ........................... 128/653.2, 653.5; 324/309, 318, 322

[56] References Cited

U.S. PATENT DOCUMENTS

| | | | |
|---|---|---|---|
| 4,564,017 | 1/1986 | Glover | 128/653.2 |
| 4,979,512 | 12/1990 | Heubes | 128/653.2 |
| 5,017,870 | 5/1991 | Kasugi et al. | 128/653.2 |

FOREIGN PATENT DOCUMENTS 1214356   8/1989   Japan .

*Primary Examiner*—Ruth S. Smith
*Attorney, Agent, or Firm*—Antonelli, Terry, Stout & Kraus, LLP

[57] ABSTRACT

An external trigger method in a magnetic resonance inspection apparatus includes the steps of inputting collectively imaging control data including an imaging portion of a subject, the kind of sequences, a time interval between the sequences and the number of times of repetition of the sequences, executing a pre-processing sequence corresponding to the imaging sequence set to be first executed, and checking whether the time interval until the start of the imaging sequence to be next executed is set to a predetermined value. The imaging sequence is started by an external trigger when the time interval is set to the indefinite value. The imaging sequence is started after the passage of the time of the predetermined value when the time interval is set to the predetermined value.

19 Claims, 4 Drawing Sheets

SCAN TIME = INSPECTION TIME = 0.24s × 256 × 1
= 61.5s

HIGH SPEED IMAGING
SCAN TIME = INSPECTION TIME = 0.04s × 256
= 10.24s

EXTERNAL TRIGGER IMAGING METHOD AND APPARATUS IN MAGNETIC RESONANCE INSPECTION APPARATUS

This application is a continuation of application Ser. No. 07/741,596, filed on Aug. 7, 1991 now abandoned.

BACKGROUND OF THE INVENTION

This invention generically relates to a magnetic resonance inspection apparatus. More specifically, the present invention relates to an external trigger imaging method and apparatus in a magnetic resonance inspection apparatus which will be suitable for the preparation of a plurality of slice images by continuous imaging, and which can facilitate breath holding scan imaging for reducing body motion-induced artifacts.

An ordinary imaging process in a conventional magnetic resonance inspection apparatus involves the steps of determining an inspection sectional plane or planes (slice plane(s)) of a subject, setting a sequence condition, starting a data fetch sequence by a scan start command by an operator and forming various images. In this case, imaging is generally carried out continuously by gradually changing the slice position of the subject and a plurality of sectional plane images are formed. This method is referred to as a "plurality-of-slices imaging".

Conventionally, the time required for imaging one slice image, for example, has been longer in the magnetic resonance inspection apparatus than in an X-ray CT, or the like. Particularly when those portions of a patient which move with his breathing such as the abdomen are to be imaged, therefore, body motion of the patient occurs unavoidably during the imaging process for a long time, and artifacts which result from breathing motion have been a serious problem. As to this problem, high speed imaging has been achieved in recent years and breath holding imaging has become possible with the reduction of the imaging time by the patient cooperation of holding his breath during imaging. Thus, the reduction of the artifacts have become technically possible.

An example of the timing chart of the conventional sequence for imaging a plurality of slice images is shown in FIG. 1 and the problems with the conventional method will be explained with reference to this timing chart. In the imaging process for imaging a plurality of slice images in the timing chart shown in FIG. 1, setting is made to image six slice images, for example. As other conditions, a scan parameter TR or in other words, the period of an RF (Radio Frequency) pulse is set to 240 ms, a data collection matrix is set to 256×256 and the number of times of integration of imaging under the same condition for improving an S/N ratio is set to once. The conventional process for imaging a plurality of slice images is constituted so as to sequentially obtain imaging data from slices 1 to 6 by setting a scan parameter TR to 240 ms.

In other words, since the data are measured in the sequence of 1, 2, 3, . . . , n as shown in FIG. 2, the scan time of 61.5 seconds is necessary to obtain the data for forming the images of the slice 1 to 6 by the calculation 0.24×256×1. This time is the inspection time required for the patient. In this manner, the conventional imaging sequence method needs a long inspection time and breath holding imaging of an ordinary patient is not practically possible. This problem cannot be solved so easily even if the imaging time can be shortened to certain extents.

In the imaging method in the conventional magnetic resonance inspection apparatus, the imaging sequence is operated by the "scan start" instruction of the operator. In this case, even if breath holding imaging becomes possible by high speed imaging, the breath holding timing must be given by the operator to the patient due to the structural limitation of the conventional apparatus. Since the magnetic resonance inspection apparatus operates in accordance with the control sequence that is in advance set for imaging, on the other hand, it is extremely difficult to establish synchronization between the instruction of the operator and the operation of the apparatus, and to time the breath holding timing.

The use of a contrast medium for magnetic resonance imaging has been permitted recently and imaging by the use of the contrast medium has been carried out to improve the contrast inside a tissue having a small difference of signal parameters. In such an imaging process, imaging must be carried out a plurality of times at certain intervals after the administration of the contrast medium so as to measure the changes of contrast due to the contrast medium with the passage of time. In this case, the imaging condition for each imaging sequence must be set whenever the predetermined time elapses and this increases the burden of the operator.

When a plurality of slice images are to be taken, the repetition time of each sequence is set in accordance with the number of slices, so that the imaging time gets elongated and breath holding imaging becomes practically impossible.

When one sectional image is taken by high speed imaging as shown in FIG. 3, pre-processing sequence (such as the optimization of the application of a gradient magnetic field, the RF irradiation system and the RF reception system) must be incorporated before the imaging sequence in the high speed imaging process by the conventional magnetic resonance inspection apparatus. If breath holding scan imaging is effected in this case, the patient cannot easily catch the optimum timing for breath holding but moves during the imaging sequence.

SUMMARY OF THE INVENTION

In a continuous imaging process of a plurality of slices by the same or different sequences, it is an object of the present invention to provide an external trigger imaging method and apparatus which reduces the imaging time by high speed imaging, makes it possible to conduct breath holding imaging by changing a control sequence, can thus reduce body motion-induced artifacts and enables a patient to time the start timing of breath holding imaging.

To accomplish the object described above, the present invention includes an input device for collectively setting imaging control data such as an imaging portion of a patient, the kinds of sequences, time intervals between a plurality of sequences inclusive of a pre-processing sequence, the number of times of repetition of a plurality of sequences, and so forth, and executes imaging sequences by trigger signals that are generated after the pre-processing sequence is completed.

The present invention is characterized in that when the control sequence for continuous imaging is executed, all the data necessary for the formation of a sectional image are collected whenever imaging of each slice is effected.

The present invention is further characterized in that an operation device for outputting a signal that indicates the start of the execution of each sequence is disposed in the proximity of the patient and the signal generated by the patient's operation of this operation device is used as an instruction signal for the start of imaging when the time interval is not set to a definite interval.

The present invention is further characterized in that when the time intervals between a plurality of sequences are not set to definite intervals by the input device but rather an indication of not a definite interval is set by the input device, the operator generates the trigger signal for the start of execution of each sequence by the use of this input device.

In accordance with the present invention, the time intervals between the sequences are not necessarily set to definite intervals, but an indication of not a definite interval can be set when the control sequences are set, and the timing of the start of the scan operation can be set arbitrarily by the operation device disposed near the patient and operated by the patient or by the input device operated by the operator. Accordingly, the rate of operation can be improved. Particularly because the timing of the scan operation can be determined by the instruction of the patient, breath holding imaging can be carried out extremely easily.

The rate of operation can be further improved because the time intervals between the sequences can be set to an arbitrary time interval by setting in advance collectively the imaging condition of each imaging sequence. When imaging by the use of a contrast medium is carried out, the contrasted images can be taken with the passage of appropriate time by appropriate sequences.

DESCRIPTION OF THE PREFERRED EMBODIMENTS

Hereinafter, preferred embodiments of the present invention will be described with reference to the accompanying drawings.

Figure 4:
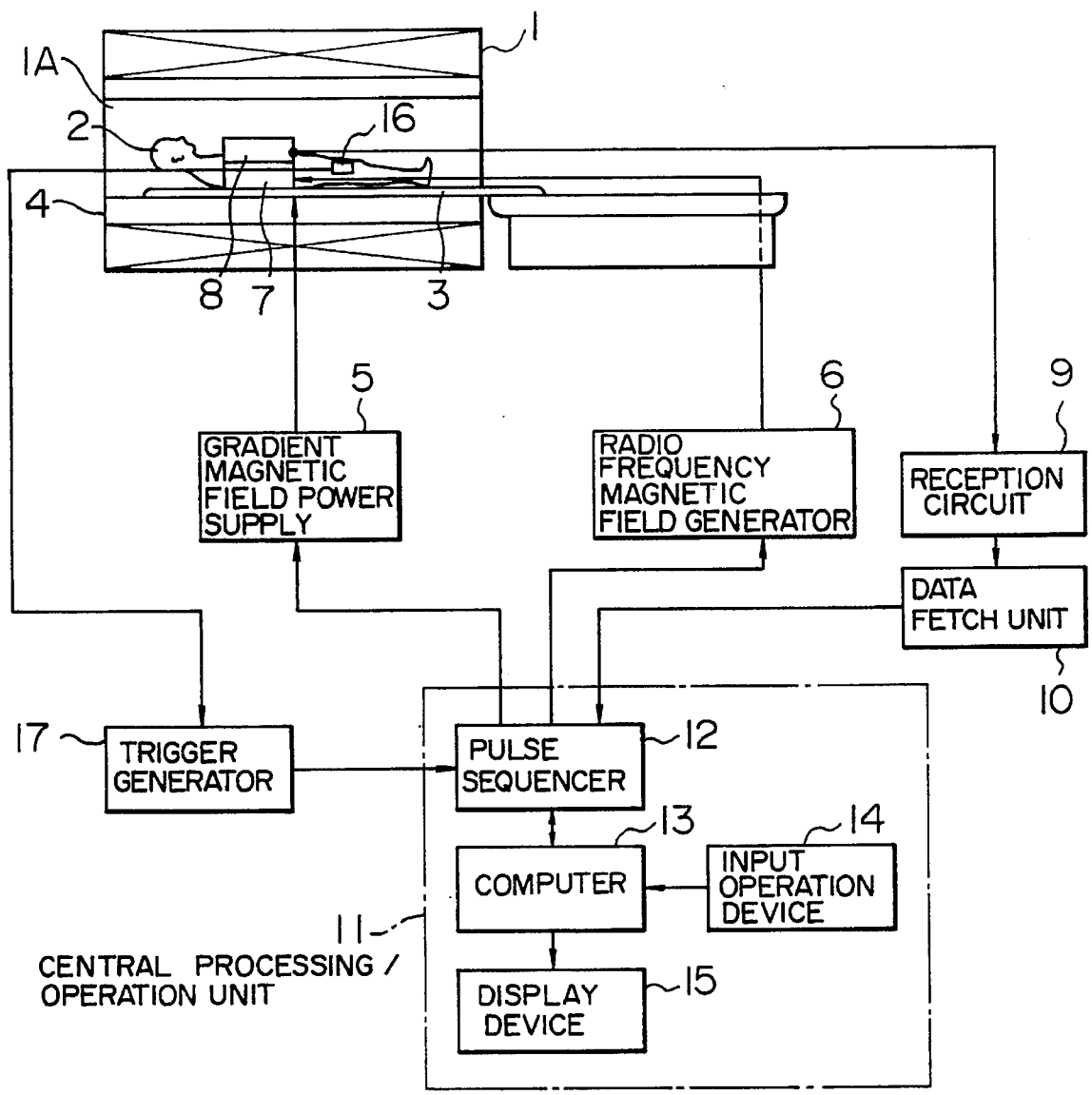
FIG. 4 is a block diagram showing the structure of a magnetic resonance inspection apparatus in accordance with the present invention.

FIG. 4 is a block diagram showing the structure of a magnetic resonance inspection apparatus in accordance with the present invention. This magnetic resonance inspection apparatus forms a sectional image of a predetermined portion of a patient (subject) by utilizing the principle of magnetic resonance imaging based on nuclear magnetic resonance.

In FIG. 4, reference numeral 1 represents a cylindrical superconductive magnet. This magnet 1 has the function of generating a predetermined electrostatic magnetic field inside an internal space 1A near its axis. In a magnetic resonance inspection apparatus, a patient or subject is set to the center position of the internal space 1A of the superconductive magnet 1 while lying on a bed 3.

A cylindrical gradient magnetic field coil 4 is disposed coaxially on the inner surface portion of the cylindrical superconductive magnet 1. The gradient magnetic field coil 4 includes a gradient magnetic field coil for generating a gradient magnetic field in a Z-axis direction which is in conformity with the axial direction of the cylindrical shape and X- and Y-axes gradient magnetic field coils for generating gradient magnetic fields in the X- and Y-axes directions crossing orthogonally the Z-axis direction, respectively. However, these three coils are not depicted dividedly in the drawing for the purpose of illustration. A gradient magnetic field power supply 5 supplies currents to the X-, Y- and Z-axes gradient magnetic field coils of the gradient magnetic field coil 4 to independently generate the gradient magnetic fields. The body portion of the patient the sectional image of which is to be taken is stipulated by the combination of the gradient magnetic fields generated by the X-, Y- and Z-axes gradient magnetic field coils, and necessary magnetic resonance signals can be picked up from this portion.

Reference numeral 6 represents a radio frequency magnetic field generator. This generator 6 supplies a radio frequency current to a radio frequency irradiation coil 7 disposed near the patient 2 and irradiates a radio frequency magnetic field from the radio frequency irradiation coil 7 to the patient 2. When the radio frequency magnetic field is applied to the patient who is set inside the electrostatic magnetic field, nuclear magnetic resonance takes place in the body of the patient 2.

When magnetic resonance signals develop due to this nuclear magnetic resonance, the signals are detected by a radio frequency reception coil 8. The signals thus received by the radio frequency reception coil 8 are inputted to a reception circuit 9.

The operations of the gradient magnetic field power supply 5, the radio frequency magnetic field generator 6, and so forth, are controlled on the basis of the imaging sequence instruction that is outputted from a pulse sequencer 12 disposed inside a central processing/operation unit 11. The imaging portion of the patient 2 is stipulated in accordance with the imaging sequence and the echo of the magnetic resonance signal generated from that portion is obtained by the reception coil 8 and the reception circuit 9, is fetched into the pulse sequencer 12 through a data fetch portion 10 and is further inputted to a computer 13 which executes signal processing as well as image processing. The central processing/operation unit 11 is provided further with an input operation device 14 and a display device 15. The input operation device 14 is operated by an operator and can set the imaging sequence and input instructions such as the imaging start instruction. A CRT, for example, is used as the display device 15, and the computer 13 effects data processing of the acquired image signals and image processing to display a sectional image on the display device 15. In such data processing and image processing, measurement of the echo signals is made a plurality of times in the same phase encoding to improve a signal-to-noise (S/N) ratio and the data are integrated. Thereafter, image reconstruction is made by two-dimensional high speed Fourier transform.

Reference numeral 16 represents an operation switch which is disposed near at hand of the patient 2. This operation switch 16 is for applying a scan start instruction to the central processing/operation unit 11. When the operation switch 16 is pushed by the patient 2, a trigger signal outputted from a trigger generator 17 is applied to the pulse sequencer 12 of the central processing/operation unit 11 and the scan operation is started.

Figure 5:
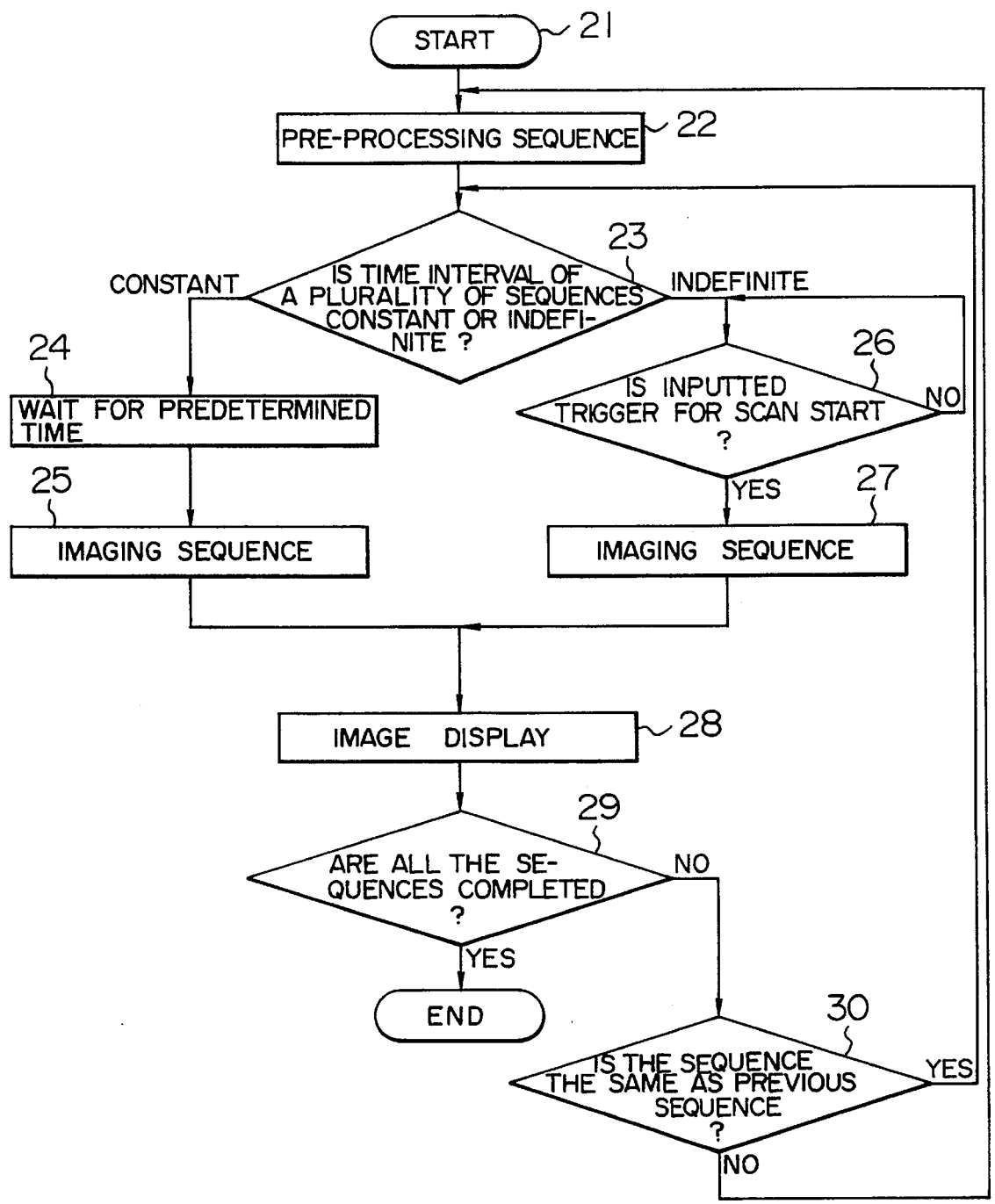
FIG. 5 shows a flowchart of an imaging control in accordance with the present invention.

Next, the operations of the magnetic resonance inspection apparatus having the structure described above will be explained. FIG. 5 shows a control flowchart when a plurality of imaging sequences are executed by the use of the magnetic resonance inspection apparatus of the present invention.

To begin with, the operator operates the input operation device 14 of the central processing/operation unit 11 and sets the sequences for imaging the sectional images, the time interval of each sequence, the number of times of repetition of the imaging operations, and so forth.

Setting can be made in the following various ways.

(1) When the same sequence is set a plurality of times and the time interval between each sequence is not set to a definite time interval and therefore is considered to be set to "indefinite":

In this case, the computer 13 detects the input of an indication "indefinite" or not definite and recognizes the time interval of each sequence as infinity. Accordingly, the apparatus does not by itself start the scan operation automatically. The patient 2 operates the operation switch 16 at hand in accordance with this physical condition to generate the trigger signal from the trigger generator 17. The scan operation of each sequence is thus started. In this case, the trigger signal from the trigger generator 17 can be inputted to the computer 13. In this case, it is also possible to set the condition for imaging from the operator side and to start the scan operation of each sequence by the use of the signal from the input operation device 14 as the trigger for the start of the scan operation.

(2) When the same sequence is set a plurality of times and the time interval between the sequences is set to a predetermined time:

The computer 13 generates in this case the trigger signal for the start of the scan operation of each sequence. The time interval between the sequences when the apparatus executes automatically the scan operation is set by the operator through the input operation device 14, and this time interval can be set to an arbitrary time depending on various conditions.

(3) When different sequences are combined and the time interval between the sequences is set to "indefinite":

This is the same case as the item (1) described above with the exception that only the content of each sequence is different. Therefore, the trigger signal for the start of the scan operation is given either by the patient 2 or by the operator.

(4) When different sequences are combined and the time interval between the sequences is set to a predetermined time:

This is the same case as the item (2) described above with the exception that only the content of each sequence is different.

Turning back to FIG. 5, after the imaging condition is set, a scan start switch disposed in the input operation device 14 of the central processing/operation unit 11 is pushed at Step 21. Then, the pulse sequencer 12 executes the control sequence on the basis of the set content and the scan operation is started in the magnetic resonance inspection apparatus.

The pre-processing sequence is executed at Step 22 to optimize the timing of application of the gradient magnetic field, the RF irradiation system and the RF reception system.

The pre-processing sequence to optimize the timing of the application of the gradient magnetic field and the RF irradiation system is executed for each patient.

The pre-processing sequence to optimize the RF reception system is executed for each different sequence.

Next, whether the time interval of a plurality of sequences is a predetermined time or not a predetermined time (not definite) indefinite is checked at Step 23.

If the time interval is set to the predetermined time, the passage of this set predetermined time occurs (Step 24) and then the first set imaging sequence is executed (Step 25).

If the time interval is found set to "indefinite" at Step 23, whether or not the trigger for the start of the scan operation is inputted in checked (Step 26). The imaging sequence is executed only after the external trigger is inputted (Step 27).

After one imaging sequence is completed, image processing of the resulting data is carried out and the image is displayed on the display device (Step 28).

Thereafter, whether or not all the sequences are completed is checked (Step 29).

If the sequence or sequences yet to be executed remain, whether or not the sequence(s) is the same as the previous sequences is checked (Step 30). If it is the same, the flow returns to Step 23 because the pre-processing sequence is not necessary, and if it is not the same as the previous sequence, the flow returns to Step 22 because a new pre-processing must be executed.

Figure 1:
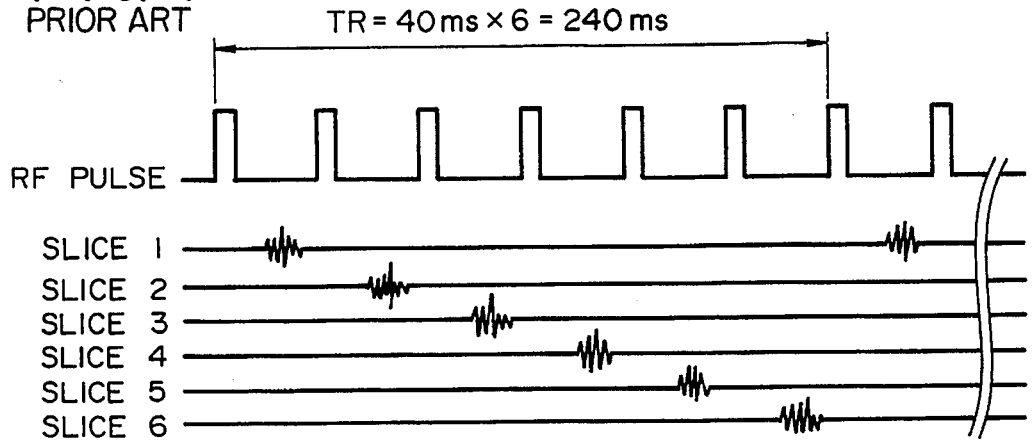
FIG. 1 shows a timing chart of an imaging sequence by a conventional apparatus.
Figure 2:
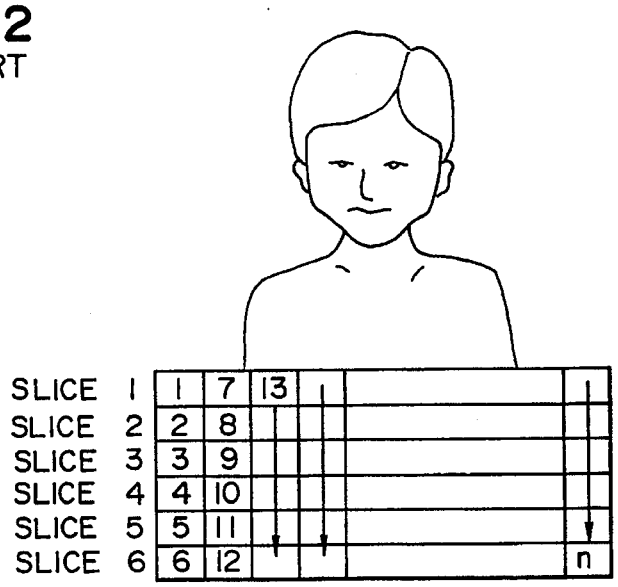
FIG. 2 shows the data measurement order in accordance with the sequence shown in FIG. 1.
Figure 3:
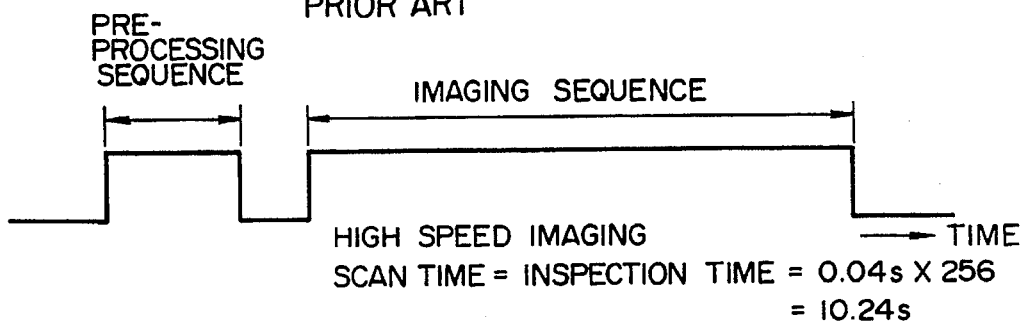
FIG. 3 shows a timing chart showing the sequence when one sectional image is taken by the conventional apparatus.

In the imaging sequence of a plurality of slices based on continuous imaging by the same or different sequences in accordance with the present invention, collection of data for each slice imaging is completed before collection of data for next slice imaging is started. If the scan parameters are set to the same condition as the condition shown in FIG. 1 in this imaging, the scan time necessary for imaging the sectional image of one slice is 0.04×256×1, that is, 10.24 seconds, because TR is 40 ms. Therefore, if imaging is made dividedly for each slice and data collection is effected, this period of 10.24 seconds is sufficiently short for the patient to hold his breathing, so that breath holding imaging can be carried out.

When breath holding imaging is carried out, setting of the item (1) or (3) described already is made as the setting of the imaging sequence of the magnetic resonance inspection apparatus. In other words, the timing of the start of the scan operation for imaging is set either by the patient 2 or by the operator. It is the most appropriate and the most desirable method which lets the patient 2 himself select the timing of the start of the scan operation. In this case, the patient 2 operates by himself the operation switch 16 before the start of each slice imaging to provide the signal to the trigger generator 17. Receiving this signal, the trigger generator 17 generates the trigger signal and gives this signal to the pulse sequence. Consequenctly, the scan operation is started and slice imaging is carried out. This imaging method allows the patient 2 to sufficiently prepare himself in advance for breath holding and imaging can be started as soon as he is ready. Accordingly, breath holding imaging can be carried out extremely easily. The time interval T1 between the sequences in this case is determined by the patient 2. It is also possible to employ the structure wherein the trigger instruction for the start of the scan operation is given when the operator operates the scan start switch of the input operation device 14 of the central processing/operation unit 11.

Figure 6:
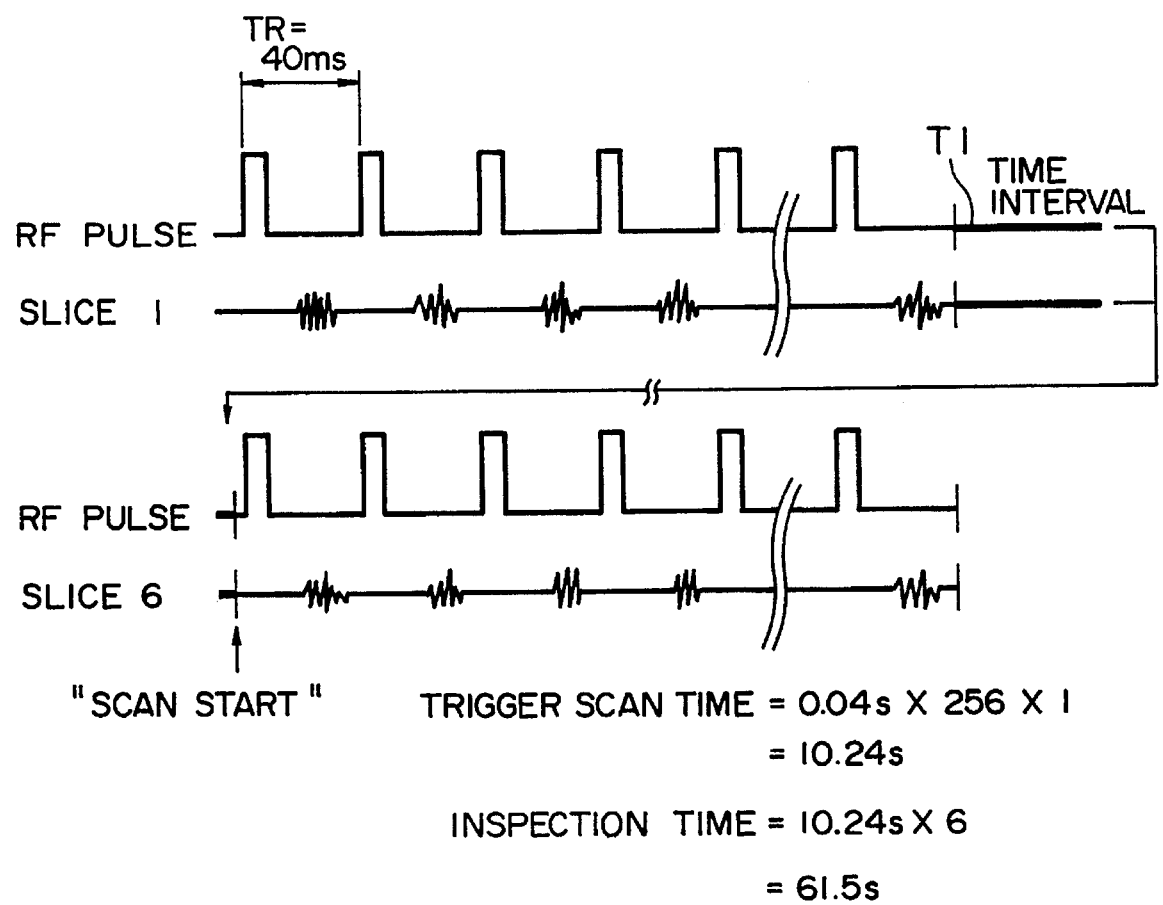
FIG. 6 shows a timing chart representing the imaging sequence in accordance with the present invention.

When the change, with time, of the contrast inside the tissue after the administration of the contrast medium is inspected in the sequence shown in FIG. 6, the time interval between the sequences can be selected appropriately.

Furthermore, an audio output device may be provided to the magnetic resonance imaging apparatus described above so that the patient and the operator can communicate with each other.

We claim:

1. An MRI method comprising the steps of:
   (a) collectively inputting imaging control data including at least an imaging portion of a subject for at least one imaging sequence of a plurality of imaging sequences, the kind of sequences, a time interval between the sequences and the number of times of repetition of the sequences;
   (b) executing a pre-processing sequence corresponding to the imaging sequence set to be first executed;
   (c) checking whether said time interval until the start of the imaging sequence to be next executed is set to a definite value; and
   (d) starting the imaging sequence by an external trigger when said time interval is not set to the definite value, and starting the imaging sequence after the passage of time of said definite value when said time interval is set to said definite value, said imaging sequence including a step of measuring a magnetic resonance signal by applying an RF signal and gradient magnetic fields.

2. An MRI method according to claim 1, wherein said external trigger is inputted by said subject from a device disposed near said subject.

3. An MRI method according to claim 1, wherein a magnetic resonance inspection apparatus is utilized and said external trigger is inputted by an operator from a device disposed near said operator of said magnetic resonance inspection apparatus.

4. An MRI method according to claim 1, which further comprises the step of:
   effecting consecutive imaging by omitting the pre-processing sequence and returning to said step (c) when the imaging sequence to be next carried out is the same as the imaging sequence effected previously.

5. An MRI method according to claim 1, wherein a magnetic resonance imaging apparatus is utilized and magnetic resonance imaging is effected by said magnetic resonance imaging apparatus.

6. An MRI method according to claim 5, further comprising the steps of executing said imaging sequence which is set already on the basis of said time interval which is set already, by omitting the pre-processing sequence when the imaging sequence to be next executed is the same as the imaging sequence which is executed previously if said imaging sequences set are a plurality of sequences, executing the pre-processing sequence corresponding to the imaging sequence to be next executed when the imaging sequence to be next executed is different from the imaging sequence which is executed already, and executing said next imaging sequence on the basis of said time interval which is set already.

7. An MRI method according to claim 1, wherein when a definite time interval is not set, starting the imaging sequence is volitionally initiated to avoid artifacts due to movement of a subject to be imaged.

8. An MRI method according to claim 1, wherein a magnetic resonance imaging apparatus is utilized having a central processing operation unit including least an input operation device, a gradient magnetic field power supply, radio frequency magnetic field generator, a reception circuit and a trigger generator.

9. An MRI method according to claim 8, wherein said imaging control data is inputted from said operation device.

10. An MRI method according to claim 9, wherein said pre-processing sequence is executed by operating said magnetic resonance apparatus.

11. An MRI method according to claim 10, wherein said automatic checking occurs in said central processing operation unit.

12. An MRI method according to claim 11, wherein said external trigger is outputted from said trigger generator.

13. An MRI apparatus, comprising:
   (1) electrostatic magnetic field generation means for forming an electrostatic magnetic field in a space in which a subject is placed;
   (2) radio frequency magnetic field generation means for applying a radio frequency magnetic field to said subject;
   (3) gradient magnetic field generation means for generating a gradient magnetic field to stipulate a portion at which a sectional image of said subject is to be formed;
   (4) control means for controlling the operations of said electrostatic magnetic field generation means, said radio frequency magnetic field generation means and said gradient magnetic field generation means in predetermined sequences;
   (5) means for detecting magnetic resonance signals from said subject and generating image signals;
   (6) means for collectively setting image control data including at least an imaging portion of said subject for at least one imaging sequence of a plurality of imaging sequences, the kind of sequences, a time interval between said sequences, and the number of times of repetition of said sequences;
   (7) external trigger signal generation means for generating a trigger signal for starting said imaging sequences;
   (8) means for checking whether said time interval until the start of the imaging sequence to be next executed is set to a definite value; and
   (9) means for starting said imaging sequence by said trigger signal when said time interval is not set to the definite value, and for starting the imaging sequence after the passage of time of the definite value when the time interval is set to the definite value.

14. An MRI apparatus according to claim 13, wherein said external trigger signal generation means is disposed proximate to said subject and is operated by said subject.

15. An MRI apparatus according to claim 14, wherein said external signal generation means includes an operation switch for operating said external trigger signal generation means.

16. An MRI apparatus according to claim 13, wherein said external trigger signal generation means includes a scan start switch operated by an operator of said MRI apparatus.

17. An MRI apparatus according to claim 13, which further comprises:
   means for executing said imaging sequence which is set already on the basis of said time interval which is set already, by omitting the pre-processing sequence when the imaging sequence to be next executed is the same as the imaging sequence which is executed previously if said imaging sequences set are a plurality of sequences, and executing the pre-processing sequence corresponding to the imaging sequence to be next executed when the imaging sequence to be next executed is different from the imaging sequence which is executed already, and executing said next imaging sequence on the basis of said time interval which is set already.

18. An MRI apparatus according to claim 13, wherein said control means controls operations including execution of a pre-processing sequence corresponding to the imaging sequence set to be first executed.

19. An MRI apparatus according to claim 13, wherein said external trigger signal generation means is manually operable.

* * * * *